United States Patent [19]
Fuchikami

[11] Patent Number: 6,038,161
[45] Date of Patent: Mar. 14, 2000

[54] FERROELECTRIC MEMORY

[75] Inventor: Takaaki Fuchikami, Kyoto, Japan

[73] Assignee: Rohm Co., Ltd., Kyoto, Japan

[21] Appl. No.: 09/209,096

[22] Filed: Dec. 10, 1998

[30] Foreign Application Priority Data

Dec. 17, 1997 [JP] Japan ................................. 9-347651

[51] Int. Cl.⁷ .................................................. G11C 11/22
[52] U.S. Cl. .............................. 365/145; 365/63; 365/149
[58] Field of Search ..................................... 365/145, 149, 365/63, 190, 189.04, 230.05

[56] References Cited

U.S. PATENT DOCUMENTS

| | | | |
|---|---|---|---|
| 5,889,695 | 3/1999 | Kawagoe | 365/145 |
| 5,936,879 | 8/1999 | Brouwer et al. | 365/145 |
| 5,959,878 | 9/1999 | Kamp | 365/117 |

*Primary Examiner*—David Nelms
*Assistant Examiner*—Gene N. Auduong
*Attorney, Agent, or Firm*—Hoffmann & Baron, LLP

[57] ABSTRACT

A ferroelectric memory includes ferroelectric capacitors C1, C2 held different in state of polarization from each other. Because of the difference in polarization state, a BL signal on a bit line BL and a BL/ signal on a bit line (/ means inversion), during reading, are different in level from each other. During re-writing, the BL signal is inverted by an inverter 18a while the BL/ signal is inverted by an inverter 18b. A first inverted signal from the inverter 18a is inputted through the bit line BL/ to the other end of a capacitor C1 and to one end of the capacitor C2. A second inverted signal from the inverter 18b is inputted through the bit line BL to one end of the capacitor C1 and to the other end of the capacitor C2. Due to this, the capacitors C1 and C2 are returned in polarization state to a former state.

7 Claims, 14 Drawing Sheets

(A) PC SIGNAL (B) WE SIGNAL (C) RD SIGNAL (D) WL SIGNAD (E) D<sub>IN</sub> SIGNAL (F) I<sub>SW</sub> SIGNAL (G) SA SIGNAL (H) BL SIGNAL (I) $\overline{BL}$ SIGNAL

DETA SET   WRITING   STAND-BY

FERROELECTRIC MEMORY

BACKGROUND OF THE INVENTION

1. Field of the Invention

This invention relates to ferroelectric memories, and more particularly to a ferroelectric memory formed by cells each having two ferroelectric capacitors and two pass transistors wherein these two ferroelectric capacitors have their one ends connected respectively to first and second bit lines through pass transistors.

2. Description of the Prior Art

FIG. 13 shows a conventional ferroelectric memory 1 of a structure having two transistors and two capacitors. The ferroelectric memory 1 includes ferroelectric capacitors C1, C2 held in opposite polarization states to each other. When reading data, a pulse PL as shown in FIG. 14(B) is applied onto a plate line PL in a state that a pulse as shown in FIG. 14(A) is applied onto a word line WL to turn on transistors T1 and T2. This gives rise to respective voltages on the first bit line BL and the second bit line BL/(/ means inversion) correspondingly to the polarization states of the capacitors C1, C2. Because the capacitors C1, C2 are differently polarized from each other, there appears a difference in voltage between the first bit line BL and the second bit line BL/. Based on this, it is possible to determine whether the data is "0" or "1".

However, the data reading as above is so-called destructive read-out, wherein the polarization on the capacitor C1, C2 is destroyed by the pulse CL applied through the plate line PL. Due to this, data must be re-written by applying a pulse PL again onto the plate line PL. However, a plurality of cells are built on the plate line, requiring a high power to drive these cell capacitors.

SUMMARY OF THE INVENTION

It is therefore a primary object of the present invention to provide a ferroelectric memory reduced in power consumption.

According to the present invention, a ferroelectric memory, comprising: a first ferroelectric capacitor; a second ferroelectric capacitor; a first bit line; a second bit line; a first connecting means for connecting one end of the first ferroelectric capacitor to the first bit line; a second connecting means for connecting one end of the second ferroelectric capacitor to the second bit line; a third connecting means for connecting the other end of the first ferroelectric capacitor to the second bit line; fourth connecting means for connecting the other end of the second ferroelectric capacitor to the first bit line; a first supply means for supplying a first re-write signal due to a first bit line signal to the second bit line; and a second supply means for supplying a second re-write signal due to a second bit line signal to the first bit line.

The one end of the first ferroelectric capacitor is connected to the first bit line through the first connecting means, while the other end thereof is connected to the second bit line through the third connecting means. As for the second ferroelectric capacitor, the one end thereof is connected to the second bit line through the second connecting means, and the other end is to the first bit line through the fourth connecting means. A first re-write signal due to the first bit line signal is supplied to the second bit line by the first supply means. Also, a second re-write signal due to the second bit line signal is supplied to the first bit line by the second supply means.

In one aspect of the present invention, the first supply means includes a first inverter means to invert the first bit line signal to create the first re-write signal. The second supply means also includes a second inverter means to invert the second bit line signal to create the second re-write signal.

In another aspect of the present invention, a current supply means supplies constant currents respectively to the first bit line and the second bit line. Also, a fifth connecting means connects the other end of the first ferroelectric capacitor to a reference potential point, and a sixth connecting means for connecting the other end of the second ferroelectric capacitor to the reference potential point.

In one embodiment of the present invention, a first control means turns on/off the first connecting means and a second control means turns on/off the second connecting means. Also, a third control means turns on/off the third connecting means and a fourth control means for turning on/off the fourth connecting means. Further, a fifth control means for turning on/off the fifth connecting means and a sixth control means for turning on/off the sixth connecting means.

A first enabling means for enabling the first supply means and the second supply means during re-writing, wherein the first to fourth control means turn on the first to forth connecting means, and the fifth and sixth control means turning off the fifth and sixth connecting means during the re-writing.

A second enabling means for enabling the current supply means during reading, wherein the first and second control means turn on the first and second connecting means during the reading, the third and fourth control means turning off the third and fourth connecting means, and the fifth and sixth control means turning on the fifth and sixth connecting means during the reading.

All of the first to sixth connecting means are turned off during standing-by.

According to the present invention, the first and second ferroelectric capacitors are inserted between the first and second bit lines so that second and first re-write signals are respectively supplied onto the first and second bit lines. Accordingly, there is no necessity of using a drive voltage for re-writing, reducing power consumption. Also, no especial sequence is required for re-writing, shortening access time. Furthermore, because, during reading, constant currents are supplied to the first and second bit lines, no drive voltage is required with reduced power consumption and shortened read time.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram showing a state of connection during stand-by;

DETAILED DESCRIPTION OF THE PREFERRED EMBODIMENTS

Figure 1:
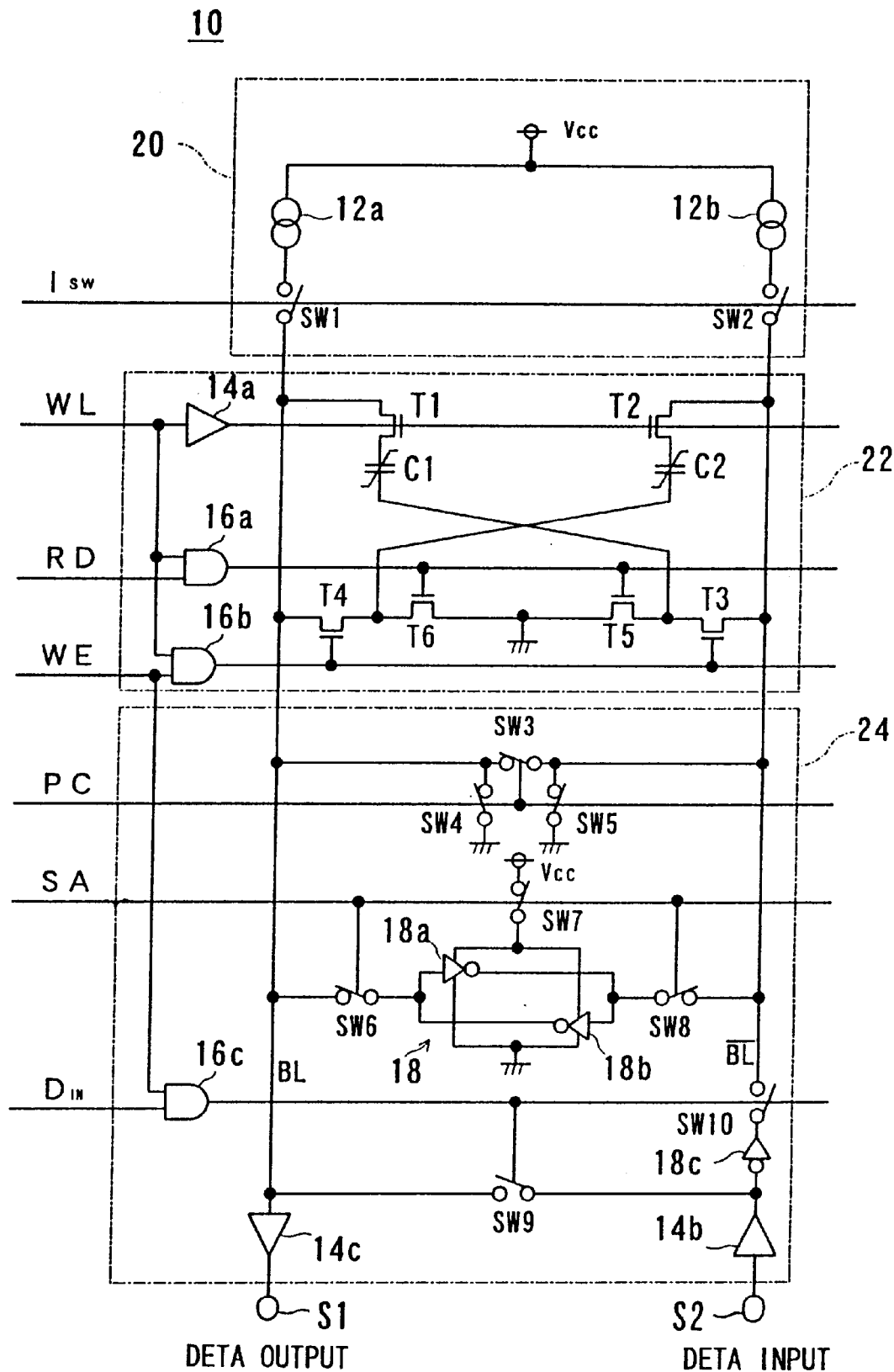
FIG. 1 is a block diagram showing one embodiment of the present invention.

Referring to FIG. 1, a ferroelectric memory 10 in this embodiment includes a cell 22. The cell 22 has two ferroelectric capacitors C1, C2. The capacitor C1 has one end connected through a transistor T1 to a first bit line BL, while the capacitor C2 has one end connected through a transistor T2 to a second bit line BL/. A buffer 14a amplifies a word line signal given through a word line WL and supplies an amplified signal to gates of the transistors T1, T2. Accordingly, the transistors T1, T2 are turned on/off in response to this amplified signal.

The capacitor C1 has the other end connected through a transistor T5 to a ground (reference potential point), and also to the second bit line BL/ through a transistor T3. Also, the capacitor C2 has the other end connected through a transistor T6 to the ground, and also to the first bit line BL through a transistor T4. An AND circuit 16a performs logical ANDing on a read (RD) signal and a WL signal to thereby give a logical product signal to the gates of the transistors T5, T6. On the other hand, an AND circuit 16b makes logical ANDing on a write enable (WE) signal and a WL signal to thereby supply a logical product signal to the gates of the transistors T3, T4. Accordingly, the transistors T5 and T6 are turned on/off depending upon an output of the AND circuit 16a, while the transistors T3, T4 are turned on/off depending upon an output of the AND circuit 16b.

The first bit line BL is connected to a constant current source 12a through a switch SW1, while the second bit line BL/ is to a constant current source 12b through a switch SW2. The constant current sources 12a, 12b are commonly connected to Vcc. The switches SW1, SW2 are turned on/off by a switching signal Isw. Incidentally, a current supply circuit 20 is formed by the constant current sources 12a, 12b, the switches SW1, SW2, the power supply Vcc.

In an interface circuit 24, a switch SW3 is inserted between the first bit line BL and the second bit line BL/. Also, a switch SW4 is inserted between the first bit line BL and the ground, while a switch SW5 is between the second bit line BL/ and the ground. These switches SW3–SW5 are turned on by a pre-charge signal (PC signal), whereupon the first bit line BL and the second bit line BL/ are charged to 0 volt.

Between the first bit line BL and the second BL/ are also inserted a switch SW6, an inversion signal supply circuit 18 and a switch SW8. That is, the switch SW6 has one end connected to the first bit line BL and the other end connected to an input terminal of an inverter 18a and to an output end of an inverter 18b. Further, the switch SW8 has one end connected to an output terminal of the inverter 18a and to an input terminal of the inverter 18b, and the other end connected to the second bit line BL/. Also, the inverters 18a, 18b has respective power supply terminals connected to the power supply Vcc through a switch SW7. The switches SW6–SW8 are turned on/off in response to a sense amplifier signal (SA signal).

If a first bit line signal on the first bit line BL is below a predetermined threshold, the inverter 18a outputs a high level signal. If the first bit line signal is greater than the threshold, the inverter 18a outputs a low level signal. On the other hand, a second bit line signal on the second bit line BL/ is below a threshold, the inverter 18b outputs a high level signal. When the second bit line signal is greater than the threshold, the inverter 18b outputs a low level signal.

The first bit line BL is connected to an output terminal S1 through a buffer 14c, while the second bit line BL/ is connected to an input terminal S2 through an inverter 18c and buffer 14b. Further, a switch SW9 is inserted between an input terminal of the buffer 14c and an output terminal of the buffer 14b. An AND circuit 16c performs logical ANDing on a WE signal and a data input signal Din for defining data input timing, to thereby supply a logical product signal to switches SW9 and SW10. Accordingly, the switches SW9, SW10 are turned on/off in response to an output of the AND circuit 16c.

Figure 2:
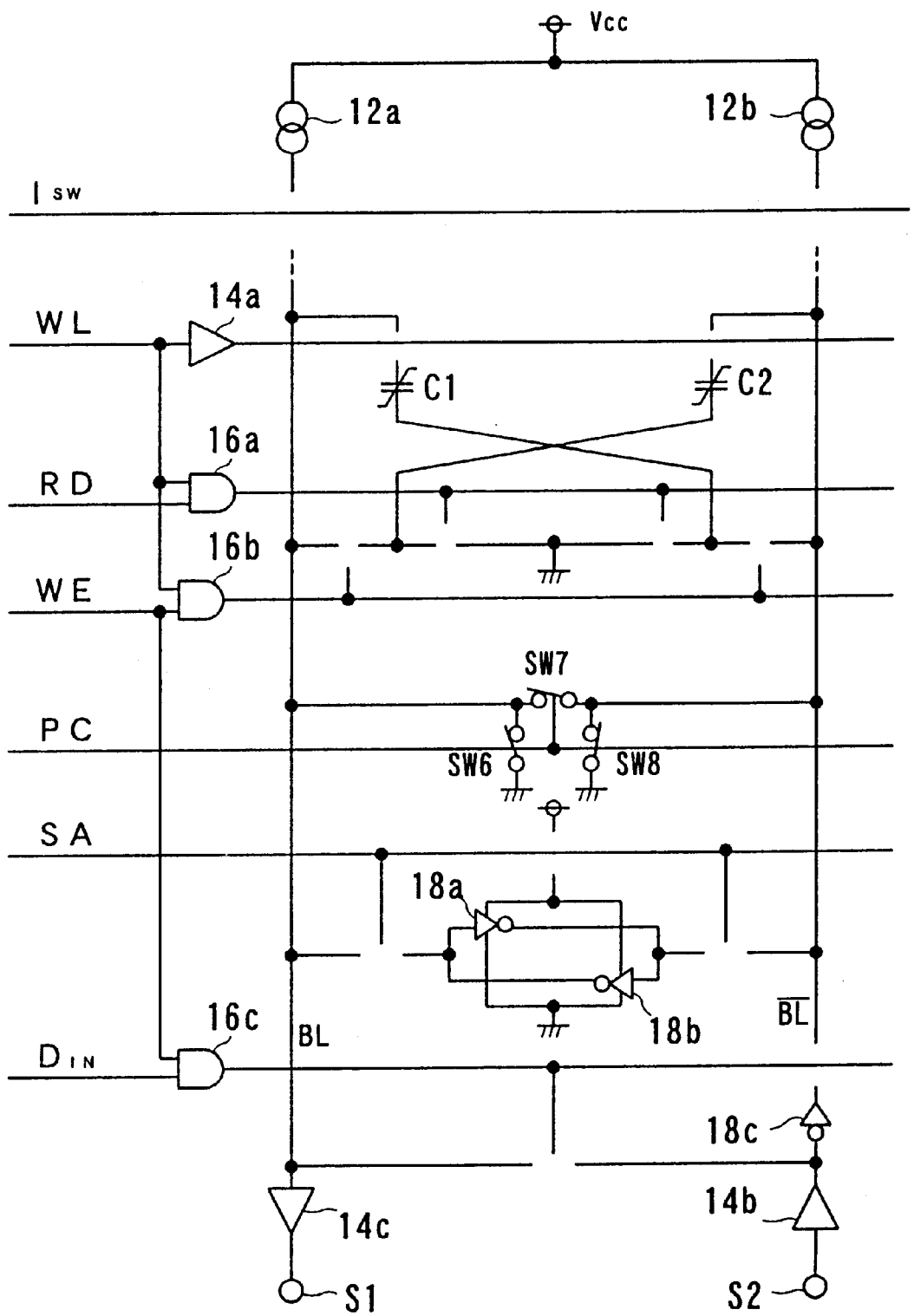
FIG. 2 is a circuit diagram showing a state of connection during pre-charge.
Figure 10:
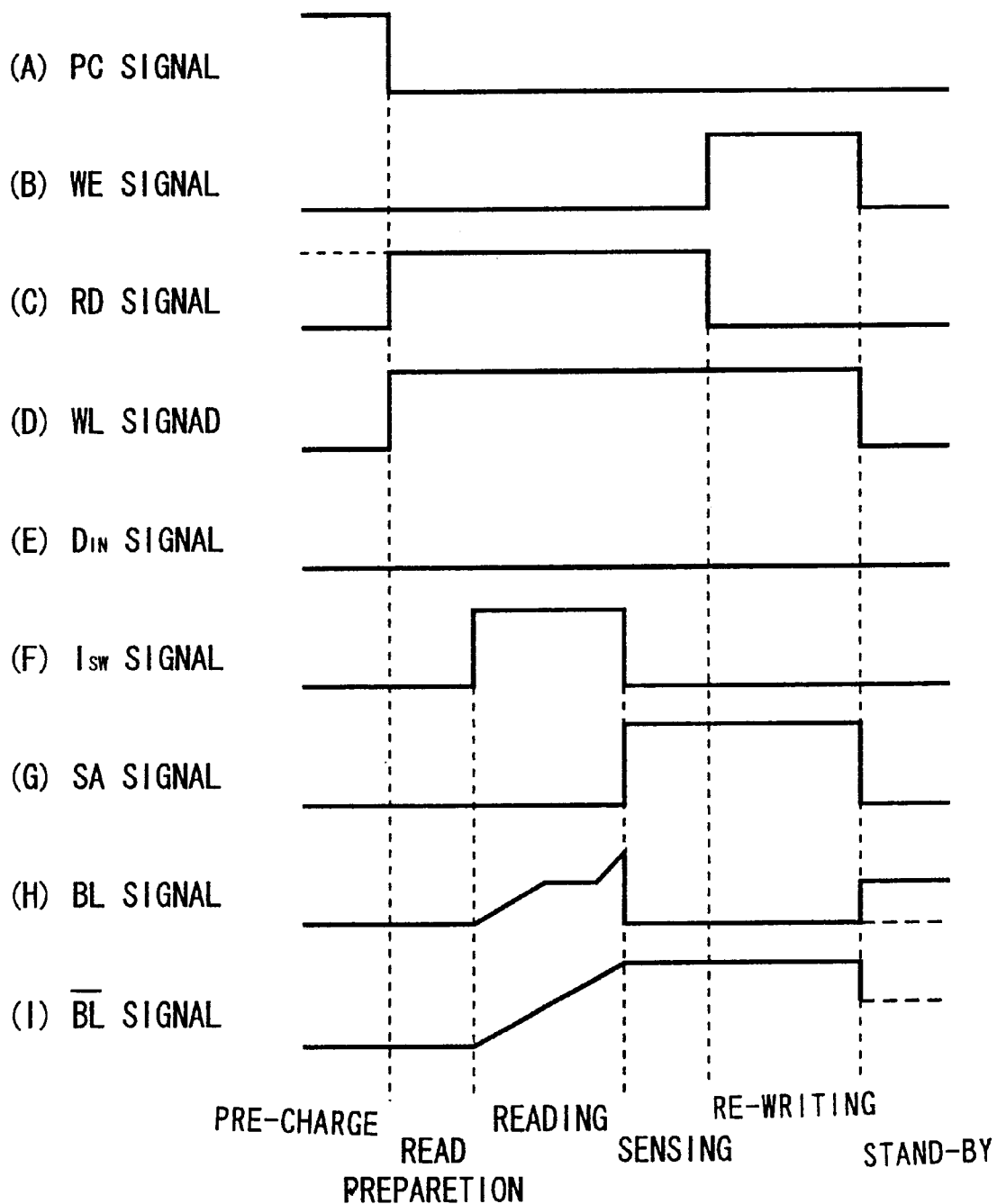
FIG. 10 is a timing chart showing part of operation in a read-out mode in the FIG. 1 embodiment.

When reading the data written on the cell 22, the above-stated signals are varied as shown in FIG. 10. During a pre-charge period, the PC signal is high in level as shown in FIG. 10(A) while the WE signal, WL signal, Din signal, Isw signal and SA signal are low in level as shown in FIGS. 10(B)–(G). Incidentally, the RD signal may be in a high or low level. This causes the switches SW3–SW5 to be turned on, and the switches SW1, SW2 and SW6–SW10 to be turned off. Also, the transistors T1–T6 are all turned off. That is, the circuit of FIG. 1 becomes equivalent to that of FIG. 2. As will be understood from FIG. 2, the first bit line BL and the second bit line BL/ are grounded thereby bringing the first and second bit line signals to low levels as shown in FIGS. 10(H) and (I).

Figure 3:
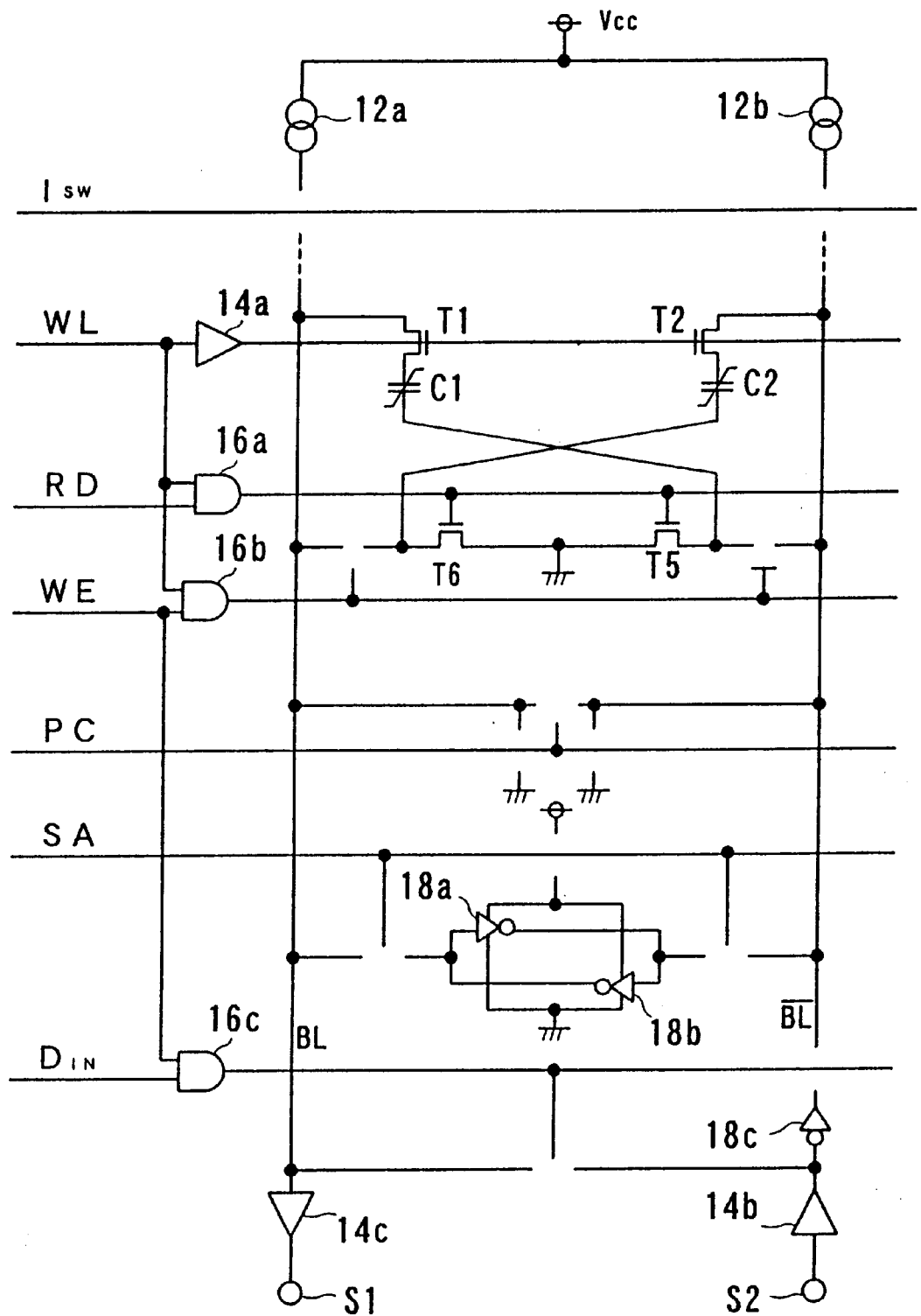
FIG. 3 is a circuit diagram showing a state of connection during read preparation.

During a read preparing period, the WL signal is high in level as shown in FIG. 10(D). Due to this, the switches SW3–SW5 are turned off and the transistors T1, T2 and the transistors T5, T6 are turned on. The circuit of FIG. 1 becomes equivalent to that of FIG. 3, wherein the one ends of the capacitors C1, C2 are respectively connected to the first bit line BL and the second bit line BL/ with the other ends of the capacitors C1, C2 grounded.

Figure 4:
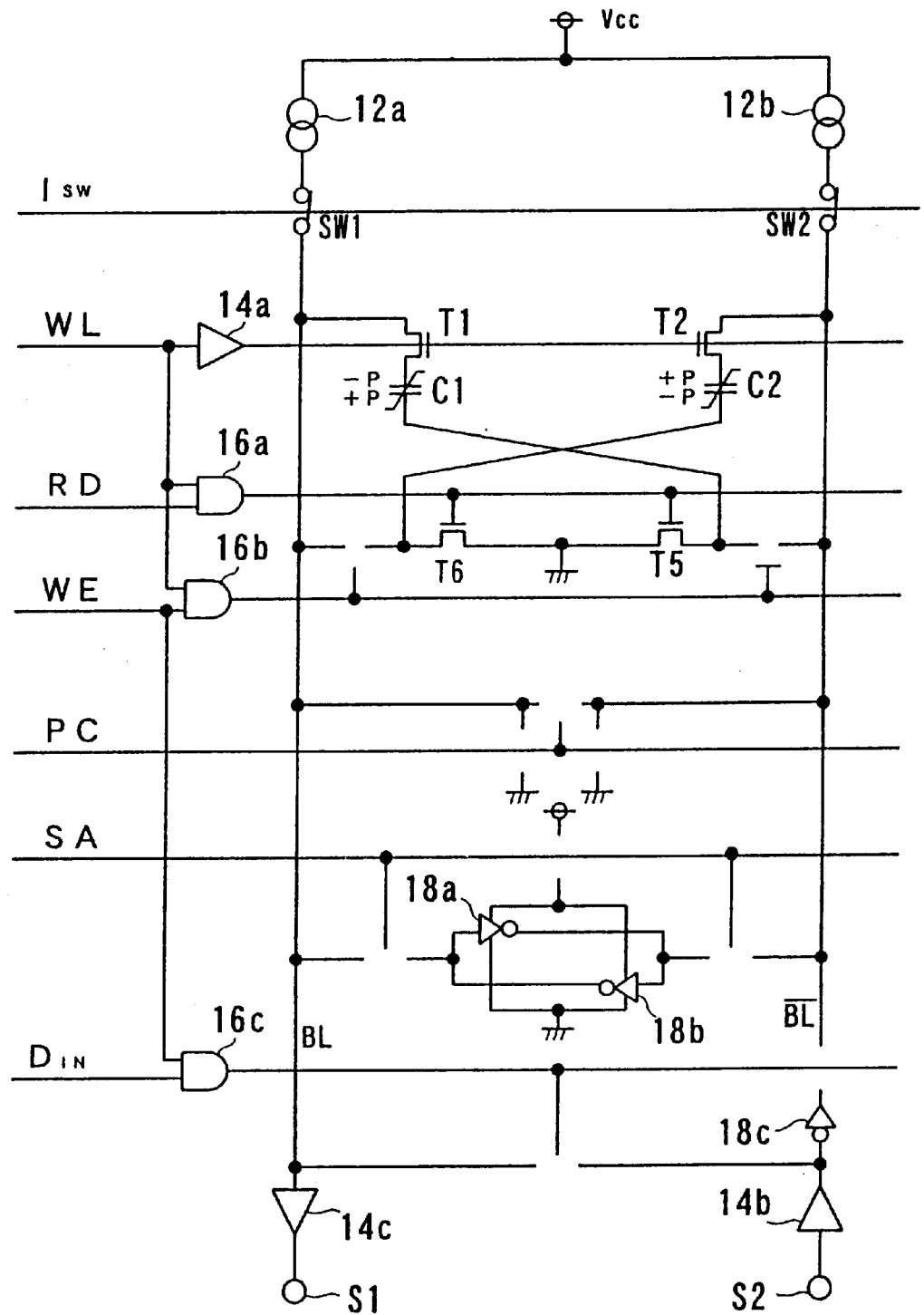
FIG. 4 is a circuit diagram showing a state of connection during reading.
Figure 5:
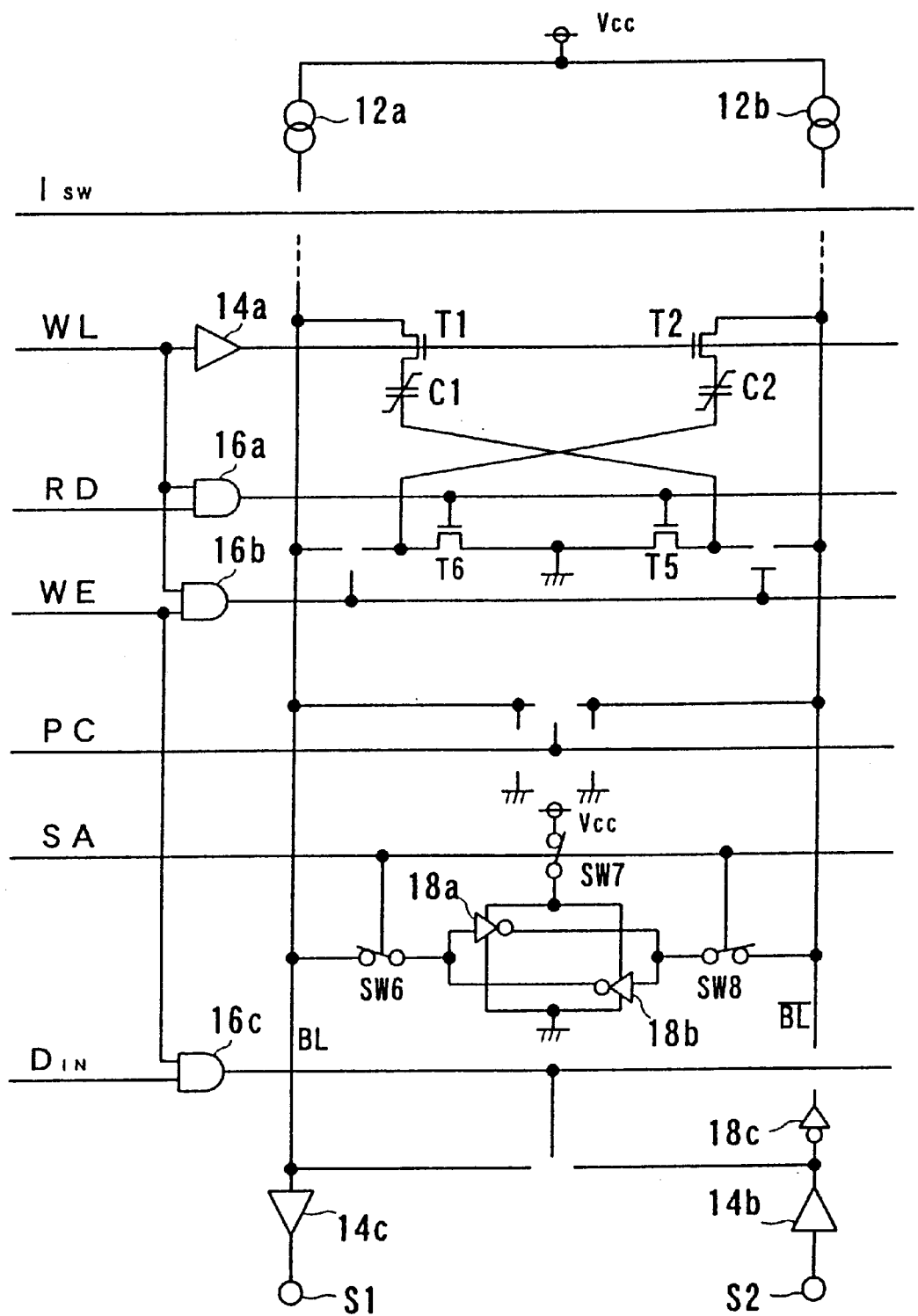
FIG. 5 is a circuit diagram showing a state of connection during sensing.
Figure 12:
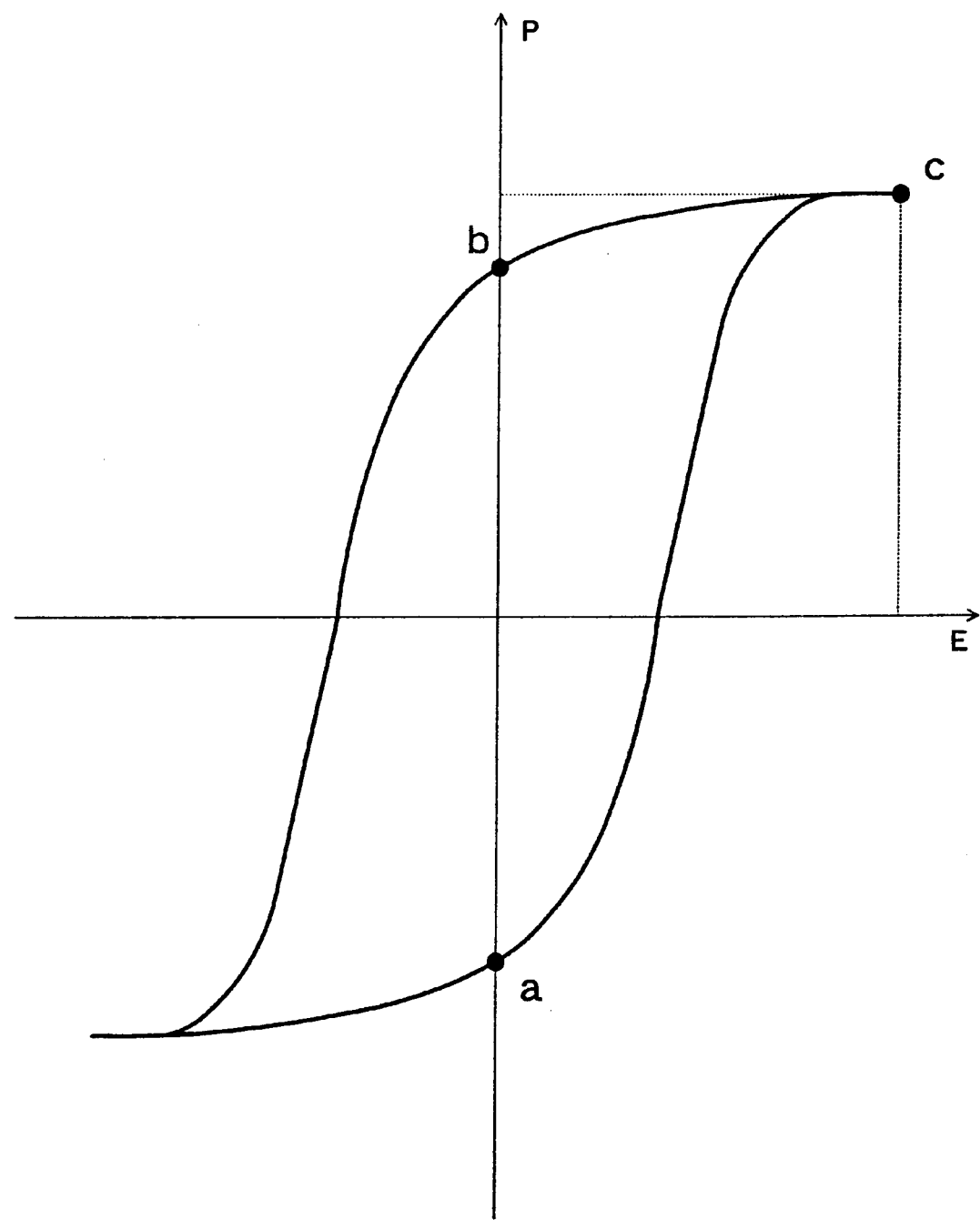
FIG. 12 is an illustrative view showing a hysteresis curve.
Figure 13:
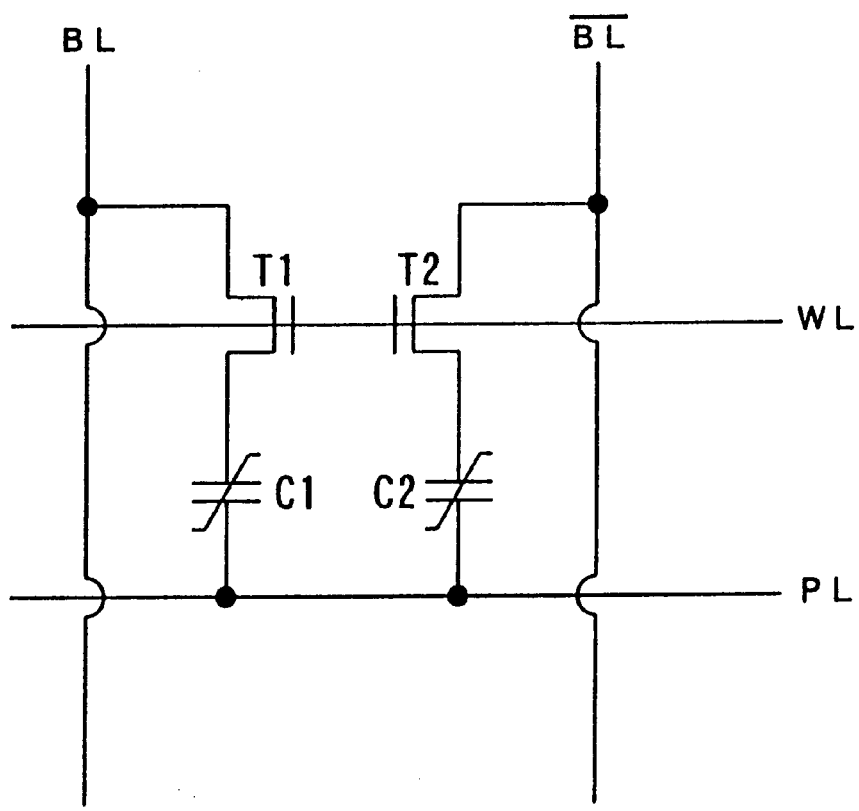
FIG. 13 is a circuit diagram showing a prior art.
Figure 14:
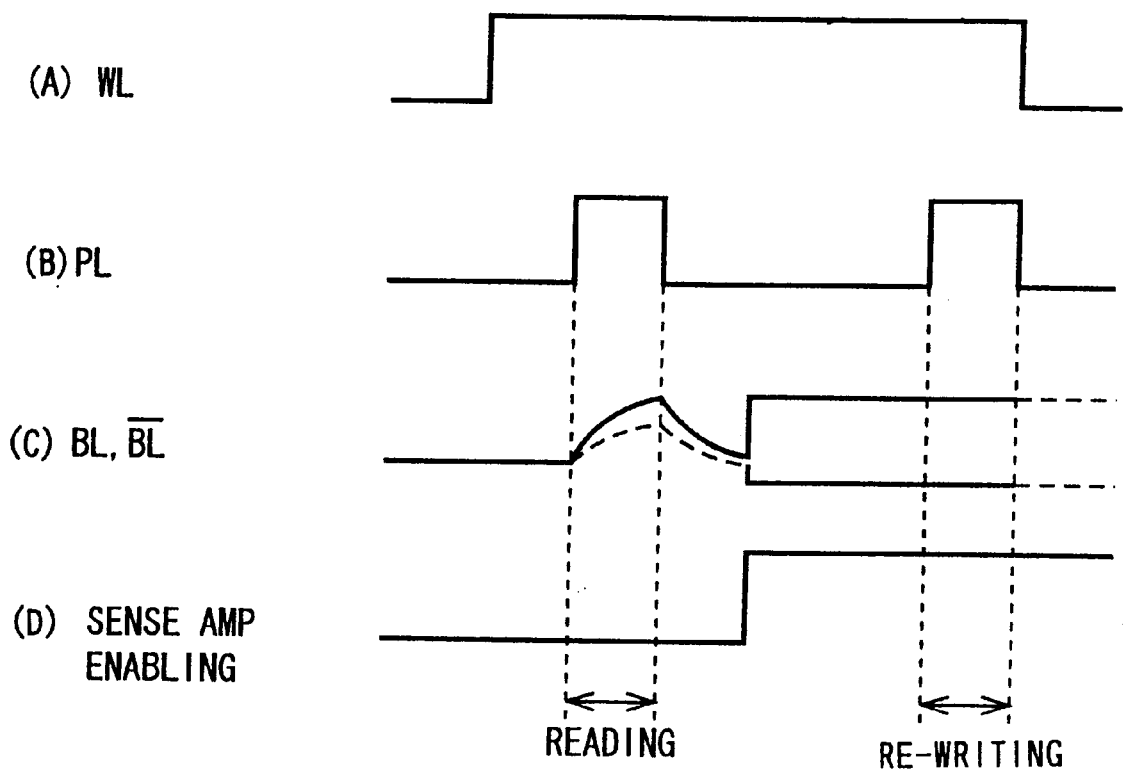
FIG. 14 is a timing chart showing part of operation in the prior art shown in FIG. 13.

When the read preparation is completed in this manner, data read-out is effected. During the read period, the RD signal and the WL signal are kept at high levels, in addition to a high level in the Isw signal shown in FIG. 10(F). This brings the switches SW1, SW2 into on states so that a constant current is supplied from the constant current source 12a onto the capacitor C1 and a constant current from the constant current source 12b is supplied onto the capacitor C2. When the capacitor C1 is polarized minus at its one end and plus at the other end as shown in FIG. 4, the capacitor C2 is polarized plus and minus respectively at its one and the other ends. Referring to FIG. 12, it is assumed that the capacitor C1 is in a polarization state "a" and the capacitor C2 is in a polarization state "b". If the capacitors C1, C2 are supplied at their one terminals with constant currents, the capacitor C1 shifts from the polarization state "a" into a polarization states "c", while, the capacitor C2 shifts from the polarization state "b" into a polarization state "c". During shifting from "a" to "c", the terminal voltage of the capacitor C1, or the level of the first bit line signal, is decreased in rise rate in the course of the shifting. On the other hand, during shifting from "b" to "c" the terminal voltage of the capacitor C2, or the level of the second bit line signal, is almost constant in rise rate as shown in FIG. 10(I). After a lapse of a predetermined period, the Isw signal becomes a low level and the switches SW1, SW2 are turned off, thereby suspending the supply of the constant currents. As a result, the capacitors C1, C2 cannot shift up to a polarization state c, giving rise to a difference in their terminal voltages. In this manner, the use of the constant current sources 12a, 12b in reading out data makes it possible to reduce the power requirement and shorten the read-out time without using a drive voltage as was required in the conventional. The RD signal and the WL signal are kept high in level, and the SA signal changes from a low level to a high level as shown in FIG. 10(G). Accordingly, the switches SW6–SW8 are brought into on as shown in FIG. 5 so that a first bit line signal is inputted to the inverter 18a and a second bit line signal is inputted to the inverter 18b. As a result of the slowdown in rise of the capacitor C1 terminal voltage during the reading, the first bit line signal comes lower in level than the threshold set in the inverter 18a. Thus the inverter 18a outputs a high level signal. On the other hand, because the terminal voltage of the capacitor C2 linearly increases, the second bit line signal exceeds in level the threshold of the inverter 18b. The inverter 18b outputs a low level signal. As will be understood from FIGS. 10(H) and (I), the first bit line signal becomes low level and the second bit line signal a high level. The first bit line signal, which is low in level, is outputted from the output terminal S1 through the buffer 14c. Because the constant current sources 12a, 12b are used for reading in this manner, the variation in the capacitance value determined by a polarization direction is positively inverted into a voltage variation. It is therefore possible to achieve stable and high-speed data read-out.

Figure 6:
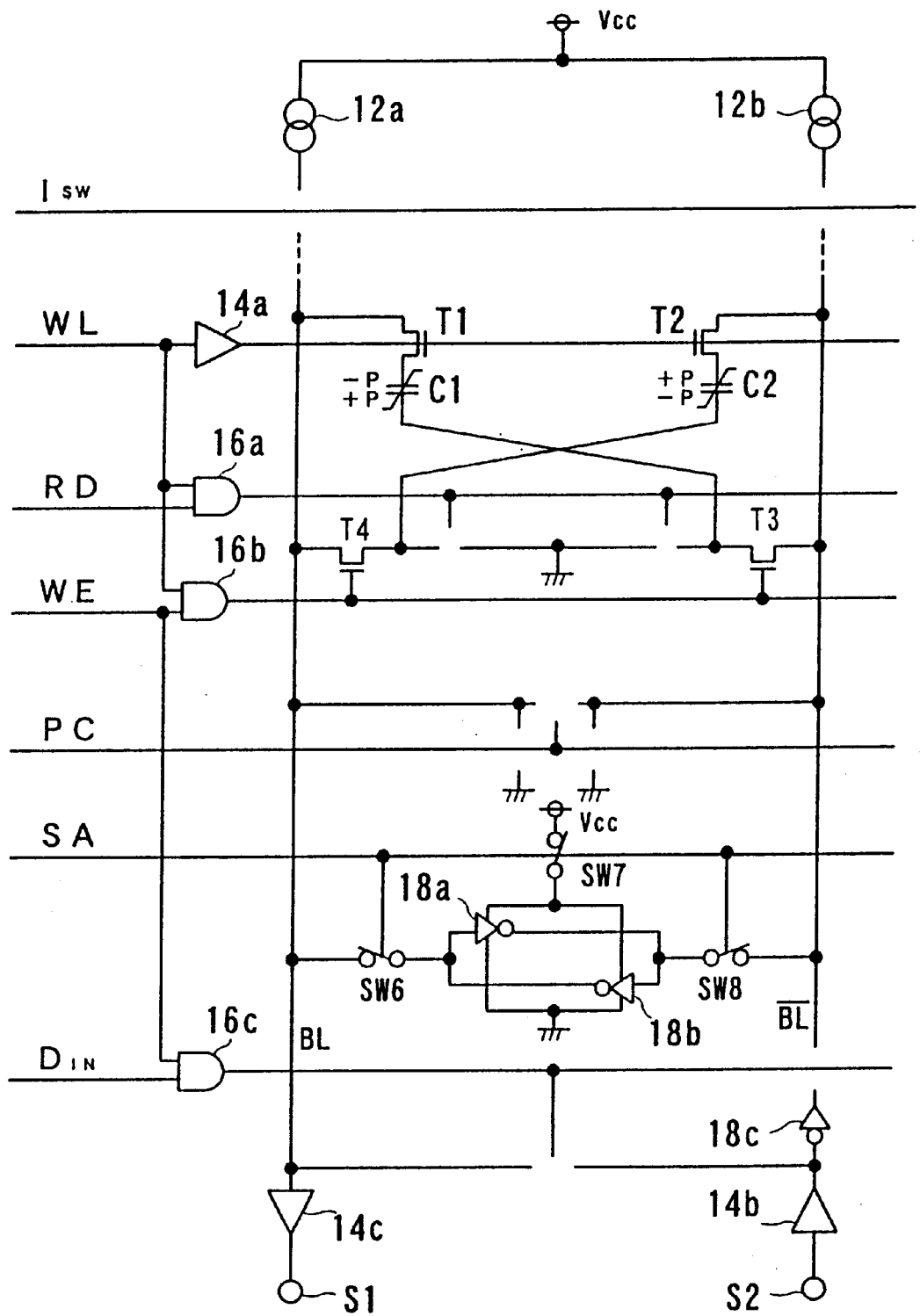
FIG. 6 is a circuit diagram showing a state of connection during re-writing.

During re-writing, the WE signal becomes high in level as shown in FIG. 10(B), while the RD signal low in level as shown in FIG. 10(C). Also, the WL signal and the SA signal are at high levels, as shown in FIGS. 10(D) and (G). Due to this, the switches and transistors are changed in connection from FIG. 5 to FIG. 6. That is, the transistors T5, T6 are turned off, and transistors T3, T4 are turned on. Accordingly, the output of the inverter 18a is supplied through the transistor T3 to the other end of the capacitor C1, and also to the one end of the capacitor C2 through the transistor T2. Also, the output of the inverter 18b is supplied through the transistor T4 to the other end of the capacitor C2, and also to the one end of the capacitor C1 through the transistor T1.

Because the high level signal is outputted from the inverter 18a, the capacitor C1 at its other end and the capacitor C2 at its one end are polarized in plus. Meanwhile, because the low level signal is outputted from the inverter 18b, the capacitor C1 at its one end and the capacitor C2 at its other end are polarized in minus. That is, the capacitors C1, C2 return to the prior polarization state to the data reading. In this manner, re-writing is effected by inverted signals outputted by the inverters 18a and 18b. Accordingly, there is no necessity to use a drive voltage as was required in the conventional, reducing power consumption. Furthermore, because no sequence for re-writing is required, shortening a re-write time.

Figure 7:
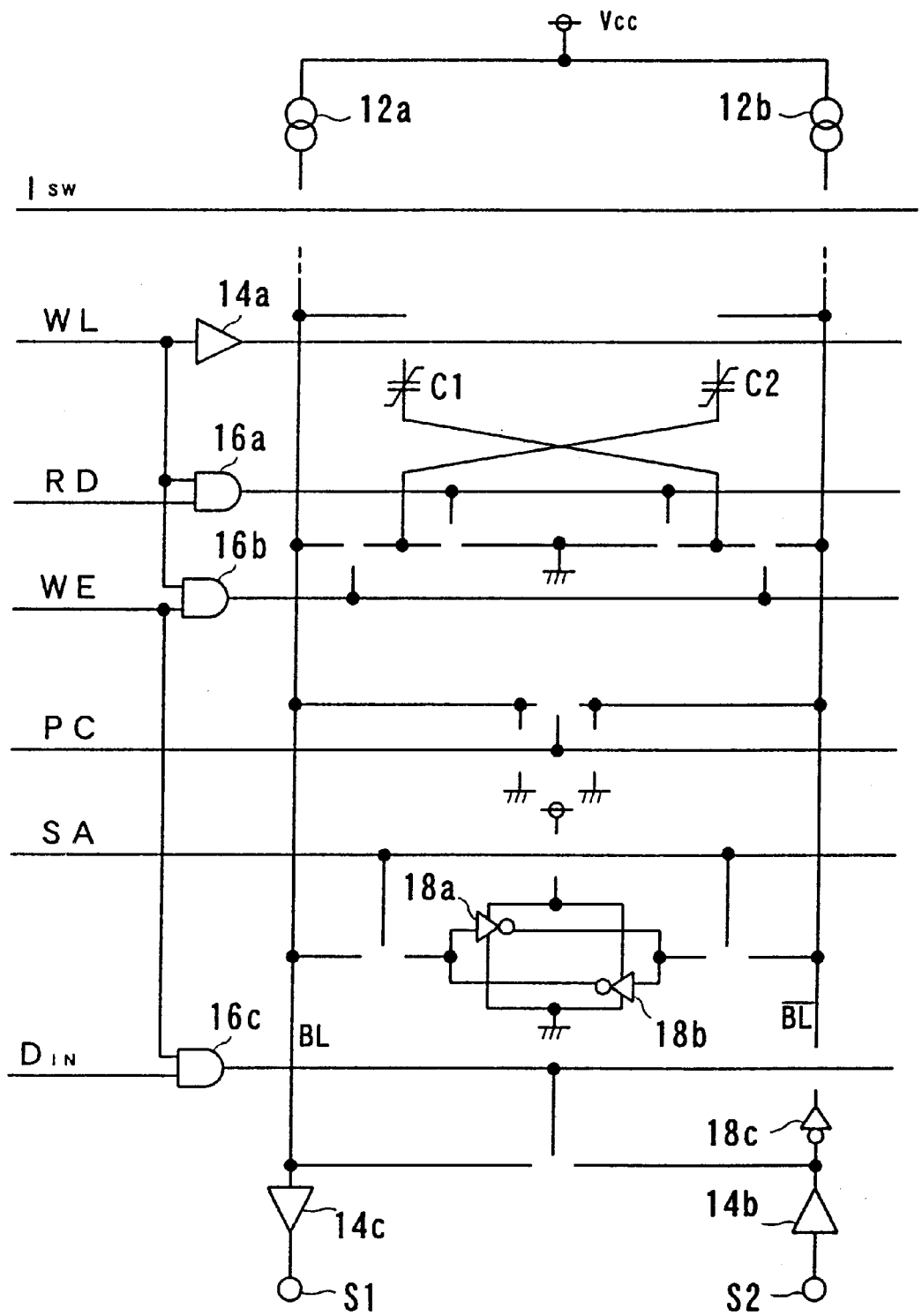

During standing-by, all the PC signal, WE signal, RD signal, WL signal, Din signal, Isw signal and SA signal are low in level so that all the switches and transistors are turned off as shown in FIG. 7. At this time, the capacitors C1, C2 at their ends are in floating states. Accordingly, the terminal voltage or stored charge on the capacitor C1, C2 is not affected by read operation in other cells, thus being free from disturbance.

Figure 8:
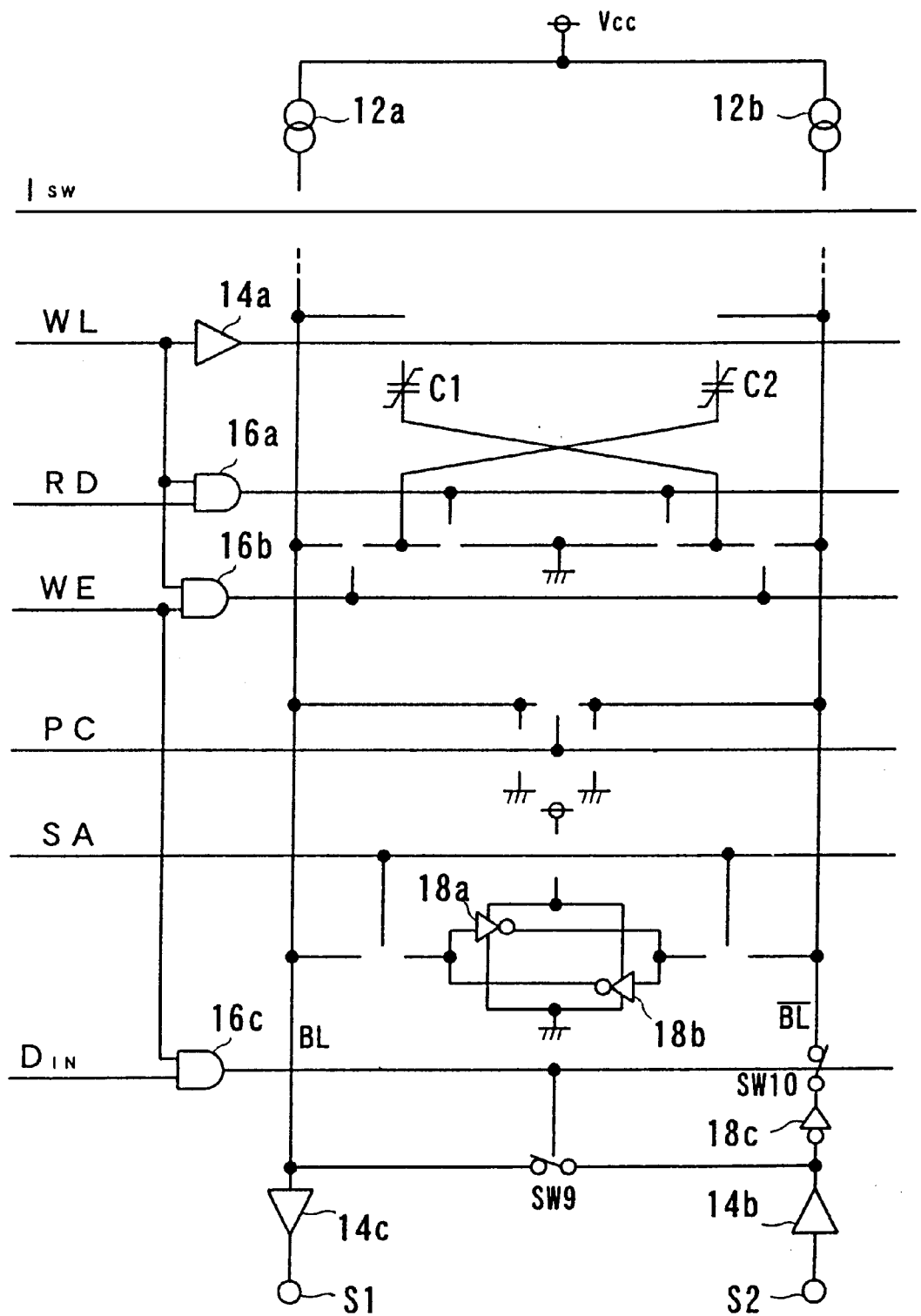
FIG. 8 is a circuit diagram showing a state of connection during data setting.
Figure 11:
FIG. 11 is a timing chart showing one part of operation in a write mode in the FIG. 1 embodiment.
Figure 11:
Figure 11:
Figure 11:
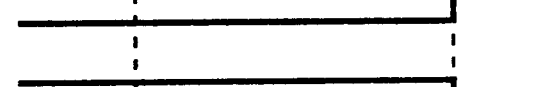
Figure 11:

During data writing, the above signals are varied in a manner as shown in FIG. 11. That is, at data setting, the Din signal only is at a high level as shown in FIG. 11(E). The PC signal, RD signal, WL signal, Isw signal and SA signal are at low levels. Note that the WE signal may be at a high or low level. At this time, the circuit of FIG. 1 becomes equivalent to that of FIG. 8, wherein the switches SW9 and SW10 only are turned on. Data is putted through the input terminal S2, and amplified by the buffer 14b. Because the output terminal of the buffer 14b is brought into direct connection to the first bit line BL and also into connection to the second bit line BL/ through the inverter 18c, when the amplified signal is at a low level, the first bit line signal is at the low level and the second bit line signal is at the high level.

Figure 9:
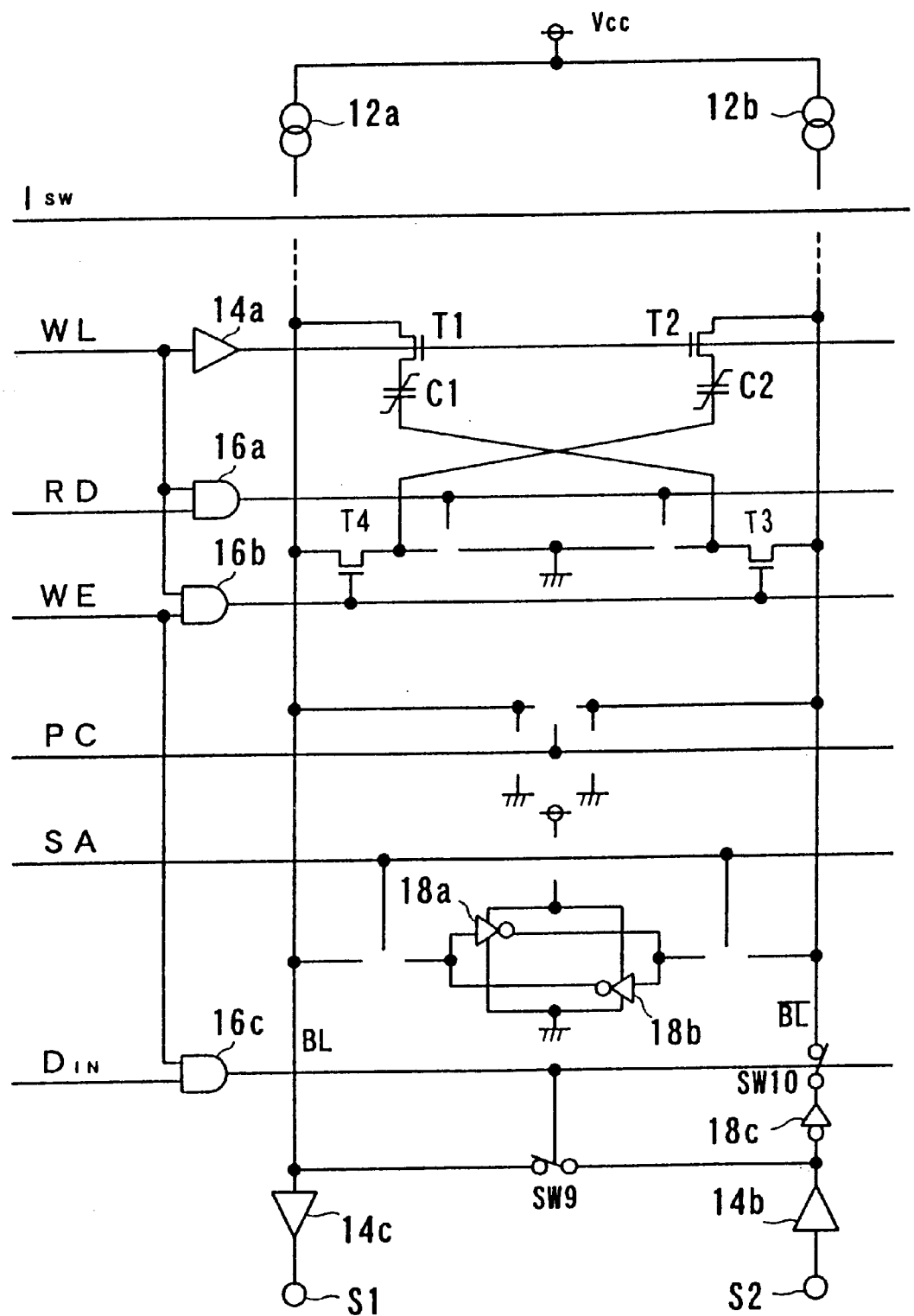
FIG. 9 is a circuit diagram showing a state of connection during writing.

During writing, the Din signal is kept at a high level as will be understood from FIG. 11(E). The WL signal is changed from a low level to a high level as will be understood from FIG. 11(D). Due to this, the transistors T1, T2 and transistors T3, T4 are turned on as shown in FIG. 9 so that the capacitors C1, C2 are polarized into a desired state. That is, data is written onto the cell 22.

After completing the writing, a stand-by state comes. That is, all the PC signal, WE signal, RD signal, WL signal, Din signal, Isw signal and SA signal become low levels. The capacitors C1, C2 at their respective ends are brought into floating states, as shown in FIG. 7. Therefore, there is no possibility that the terminal voltage of the capacitor C1, C2 be varied by write operation of data onto other cells, thus being free from disturbance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ferroelectric memory, comprising:

a first ferroelectric capacitor;

a second ferroelectric capacitor;

a first bit line, a second bit line;

a first connecting means for connecting one end of said first ferroelectric capacitor to said first bit line;

a second connecting means for connecting one end of said second ferroelectric capacitor to said second bit line;

a third connecting means for connecting the other end of said first ferroelectric capacitor to said second bit line;

a fourth connecting means for connecting the other end of said second ferroelectric capacitor to said first bit line;

a first supply means for supplying a first re-write signal due to a first bit line signal to said second bit line; and a second supply means for supplying a second re-write signal due to a second bit line signal to said first bit line.

2. A ferroelectric memory according to claim 1, wherein said first supply means includes a first inverter means to invert the first bit line signal to create the first re-write signal, and said second supply means including a second inverter means to invert the second bit line signal to create the second re-write signal.

3. A ferroelectric memory according to claim 1, further comprising:

a current supply means for supplying constant currents respectively to said first bit line and said second bit line;

a fifth connecting means for connecting the other end of said first ferroelectric capacitor to a reference potential point; and a sixth connecting means for connecting the other end of said second ferroelectric capacitor to said reference potential point.

4. A ferroelectric memory according to claim 3, further comprising:

a first control means for turning on/off said first connecting means;

a second control means for turning on/off said second connecting means;

a third control means for turning on/off said third connecting means;

a fourth connecting means for turning on/off said fourth connecting means:

a fifth control means for turning on/off said fifth connecting means; and a sixth control means for turning on/off said sixth connecting means.

5. A ferroelectric memory according to claim 4, further comprising:

a first enabling means for enabling said first supply means and said second supply means during re-writing; wherein said first to fourth control means turn on said first to forth connecting means, and said fifth and sixth control means turning off said fifth and sixth connecting means during the re-writing.

6. A ferroelectric memory according to claim 4, further comprising:

a second enabling means for enabling said current supply means during reading; wherein said first and second control means turn on said first and second connecting means during the reading, said third and fourth control means turning off said third and fourth connecting means, and said fifth and sixth control means turning on said fifth and sixth connecting means during the reading.

7. A ferroelectric memory according to claim 4, wherein said first to sixth control means turn off said first to sixth connecting means during standing-by.

* * * * *